(12) United States Patent
Kondo et al.

(10) Patent No.: US 11,573,321 B2
(45) Date of Patent: Feb. 7, 2023

(54) SEMICONDUCTOR CIRCUITRY AND DISTANCE MEASURING DEVICE

(71) Applicants: Kabushiki Kaisha Toshiba, Minato-ku (JP); Toshiba Electronic Devices & Storage Corporation, Minato-ku (JP)

(72) Inventors: Satoshi Kondo, Kawasaki (JP); Hidenori Okuni, Yokohama (JP); Tuan Thanh Ta, Kawasaki (JP); Akihide Sai, Yokohama (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 322 days.

(21) Appl. No.: 16/562,817

(22) Filed: Sep. 6, 2019

(65) Prior Publication Data

US 2020/0158872 A1 May 21, 2020

(30) Foreign Application Priority Data

Nov. 19, 2018 (JP) .............................. JP2018-216715

(51) Int. Cl.
*G01S 17/00* (2020.01)
*G01S 17/26* (2020.01)
(Continued)

(52) U.S. Cl.
CPC .............. *G01S 17/26* (2020.01); *G01S 17/14* (2020.01); *H03L 7/0818* (2013.01); *H03L 7/0992* (2013.01); *H03L 7/16* (2013.01)

(58) Field of Classification Search
USPC ....................................................... 356/5.01
See application file for complete search history.

(56) References Cited

U.S. PATENT DOCUMENTS 6,924,679 B2 * 8/2005 Seno ..................... H03L 7/0996
327/158
6,967,894 B2 * 11/2005 Kondo ............... G11C 16/0483
365/185.17

(Continued)

FOREIGN PATENT DOCUMENTS

JP 01-170221 A 7/1989
JP 05-37378 A 2/1993

OTHER PUBLICATIONS

Mota, M, et al., "A flexible multi-channel high-resolution Time-to Digital Converter ASIC", IEEE, 2001, 5 pages.

*Primary Examiner* — James R Hulka
(74) *Attorney, Agent, or Firm* — Oblon, McClelland, Maier & Neustadt, L.LP.

(57) ABSTRACT

A semiconductor circuitry includes an oscillator configured to output an oscillation signal whose frequency depends on a first input signal, a counter configured to count a number of cycles of the oscillation signal, first circuitry configured to output a first digital signal based on a first number of cycles counted by the counter within one of a clock cycle of a clock signal, wherein the first input signal is digitally converted into the first digital signal, and a second circuitry configured to output a second digital signal based on a second number of cycles counted by the counter in a period from a reference timing of the clock signal to an input timing of a second input signal within the one of the clock cycle of the clock signal, wherein the period is digitally converted into the second digital signal.

19 Claims, 18 Drawing Sheets

(51) Int. Cl.
  *H03L 7/099*  (2006.01)
  *H03L 7/081*  (2006.01)
  *H03L 7/16*   (2006.01)
  *G01S 17/14*  (2020.01)

(56) References Cited

U.S. PATENT DOCUMENTS

| | | | | |
|---|---|---|---|---|
| 8,170,171 | B2* | 5/2012 | Kobayashi | H03C 3/0941 |
| | | | | 375/376 |
| 8,451,965 | B2* | 5/2013 | Deguchi | H03L 7/1803 |
| | | | | 375/346 |
| 2002/0190283 | A1* | 12/2002 | Seno | H03K 5/135 |
| | | | | 257/275 |
| 2005/0135183 | A1* | 6/2005 | Kondo | G11C 16/0483 |
| | | | | 365/233.1 |
| 2008/0315928 | A1* | 12/2008 | Waheed | H03L 7/0991 |
| | | | | 327/159 |
| 2009/0190694 | A1* | 7/2009 | Kobayashi | H03C 3/0975 |
| | | | | 375/302 |
| 2010/0283654 | A1* | 11/2010 | Waheed | G04F 10/005 |
| | | | | 341/166 |
| 2011/0148676 | A1* | 6/2011 | Waheed | H03L 7/091 |
| | | | | 341/131 |
| 2012/0063520 | A1* | 3/2012 | Deguchi | H03L 7/1803 |
| | | | | 375/259 |
| 2013/0135606 | A1* | 5/2013 | Giacotto | G01S 7/4861 |
| | | | | 356/5.01 |
| 2014/0012528 | A1* | 1/2014 | Carmel-Veilleux | |
| | | | | H03K 17/945 |
| | | | | 702/92 |
| 2017/0234985 | A1* | 8/2017 | Kadambi | G01S 17/894 |
| | | | | 702/152 |

* cited by examiner

SEMICONDUCTOR CIRCUITRY AND DISTANCE MEASURING DEVICE

CROSS REFERENCE TO RELATED APPLICATIONS

This application is based upon and claims the benefit of priority from the prior Japanese Patent Application No. 2018-216715, filed on Nov. 19, 2018, the entire contents of which are incorporated herein by reference.

FIELD

Embodiments of the present disclosure relates to a semiconductor circuitry, and a distance measuring device.

BACKGROUND

Research and development regarding autonomous driving technology have been in progress. In the autonomous driving technology, it is necessary to measure a distance between a vehicle and surrounding objects with high accuracy. Distance measurement is performed by measuring a time from when a light signal is emitted from the vehicle until when a reflected light signal reflected by an object is received. In general, the time mentioned above is roughly measured by an A/D converter (hereinafter referred to as ADC), and is highly accurately measured by a time-to-digital converter (hereinafter referred to as TDC).

Conventionally, an ADC and a TDC for a distance measuring device have different functions and thus configured by separate circuits, whereby a mounting area becomes large at the time of mounting those circuits in the same chip, which leads to an increase in power consumption.

DETAILED DESCRIPTION

According to one embodiment, a semiconductor circuitry includes:

an oscillator configured to output an oscillation signal whose frequency depends on a first input signal;

a counter configured to count a number of cycles of the oscillation signal;

first circuitry configured to output a first digital signal based on a first number of cycles counted by the counter within one of a clock cycle of a clock signal, wherein the first input signal is digitally converted into the first digital signal; and a second circuitry configured to output a second digital signal based on a second number of cycles counted by the counter in a period from a reference timing of the clock signal to an input timing of a second input signal within the one of the clock cycle of the clock signal, wherein the period is digitally converted into the second digital signal.

Hereinafter, embodiments of the present disclosure will be described with reference to the accompanying drawings. While the following embodiments mainly describe characteristic configurations and operations in a semiconductor circuitry and a distance measuring device, in the semiconductor circuitry and the distance measuring device, there may be configurations and operations omitted in the following description.

First Embodiment

Figure 1:
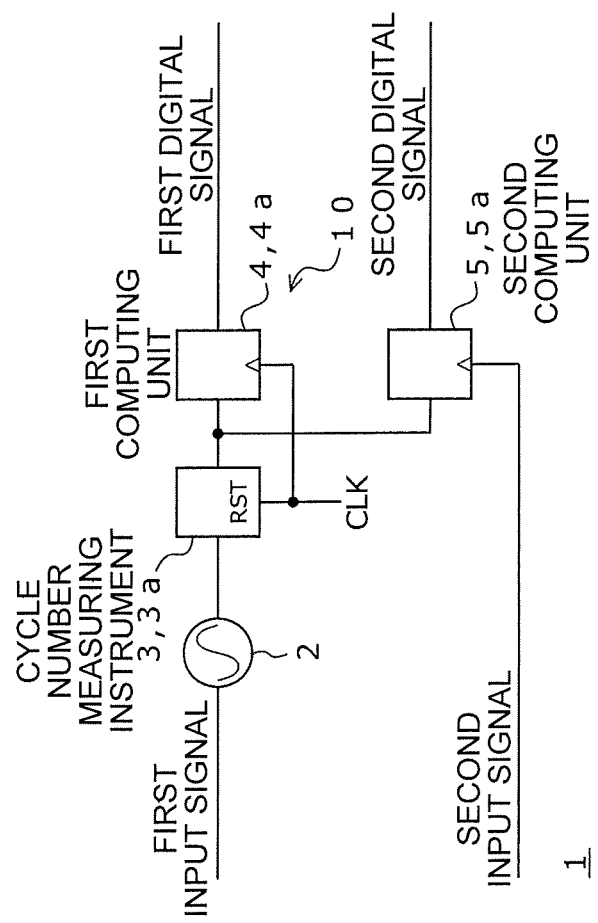
FIG. 1 is a block diagram illustrating a schematic configuration of a semiconductor circuitry according to a first embodiment.

FIG. 1 is a block diagram illustrating a schematic configuration of a semiconductor circuitry 1 according to a first embodiment. The semiconductor circuitry 1 of FIG. 1 shows a circuit configuration to be mounted on the same semiconductor substrate. The semiconductor circuitry 1 of FIG. 1 includes an oscillator 2, a cycle number measuring instrument (counter) 3, a first computing unit (first circuitry) 4, and a second computing unit (second circuitry) 5. In the present specification, the first computing unit 4 and the second computing unit 5 are collectively referred to as a computing unit 10.

The oscillator 2 outputs an oscillation signal whose frequency is modulated according to a first input signal. The oscillator 2 is, for example, a voltage controlled oscillator (hereinafter referred to as VCO) 2. The VCO 2 outputs an oscillation signal whose frequency is modulated according to a signal level of the first input signal.

The cycle number measuring instrument 3 measures the number of cycles of the oscillation signal. More specifically, the cycle number measuring instrument 3 measures the number of cycles of the oscillation signal included in a clock cycle for each clock cycle of a clock signal CLK. The clock signal CLK is a signal asynchronous to the oscillation signal of the VCO 2. The cycle of the oscillation signal of the VCO 2 fluctuates, whereas clock cycles of the clock signals CLK are the same.

The first computing unit 4 outputs, in a first clock cycle of the clock signal CLK, a first digital signal obtained by the first input signal digitally converted base on the first number of cycles measured by the cycle number measuring instrument 3. That is, the first computing unit 4 outputs the first digital signal based on the first number of cycles counted by the cycle number measuring instrument 3 within one of the clock cycle of the clock signal, the first input signal being digitally converted into the first digital signal. The first digital signal is a signal obtained by an oscillation frequency of the VCO 2 digitally converted for each clock cycle. Since the oscillation frequency of the VCO 2 is dependent on the signal level of the first input signal, the first digital signal is a signal obtained by the first input signal digitally converted.

The cycle number measuring instrument 3 includes, for example, a counter 3a. The counter 3a counts, for each clock cycle, the number of cycles of the oscillation signal included in each clock cycle. The counter 3a resets the count value at a timing when the clock signal CLK transitions. The timing at which the clock signal CLK transitions is, for example, a timing at which the clock signal CLK changes from low to high.

The first computing unit 4 includes, for example, a flip-flop (hereinafter referred to as FF) 4a. The FF 4a holds the count value of the counter 3a at the timing when the clock signal CLK transitions. The signal held by the FF 4a is to be the first digital signal. In this manner, the cycle number measuring instrument 3 and the first computing unit 4 function as an analog-digital converter (hereinafter referred to as ADC).

The second computing unit 5 outputs a second digital signal base on the second number of cycles measured by the cycle number measuring instrument 3 in a period from the reference time point of the clock signal to the timing at which the second input signal transitions. That is, the second computing unit 5 outputs the second digital signal based on the second number of cycles counted by the cycle number measuring instrument 3 in a period from a reference timing of the clock signal to the input timing of the second input signal within the one of the clock cycle of the clock signal, the period being digitally converted into the second digital signal. The second computing unit 5 includes, for example, an FF 5a. The FF 5a holds the count value of the counter 3a at the timing when the second input signal transitions. The signal held by the FF 5a is to be the second digital signal. In this manner, the cycle number measuring instrument 3 and the second computing unit 5 function as a time-to-digital converter (hereinafter referred to as TDC).

As described above, the semiconductor circuitry 1 of FIG. 1 has a circuit configuration in which the oscillator 2, the ADC, and the TDC are integrated. In particular, since the oscillator 2 and the counter 3a are shared by the ADC and the TDC, the ADC and the TDC do not need to individually include the oscillator 2 and the counter 3a, whereby a circuit size and power consumption can be reduced.

Figure 2:
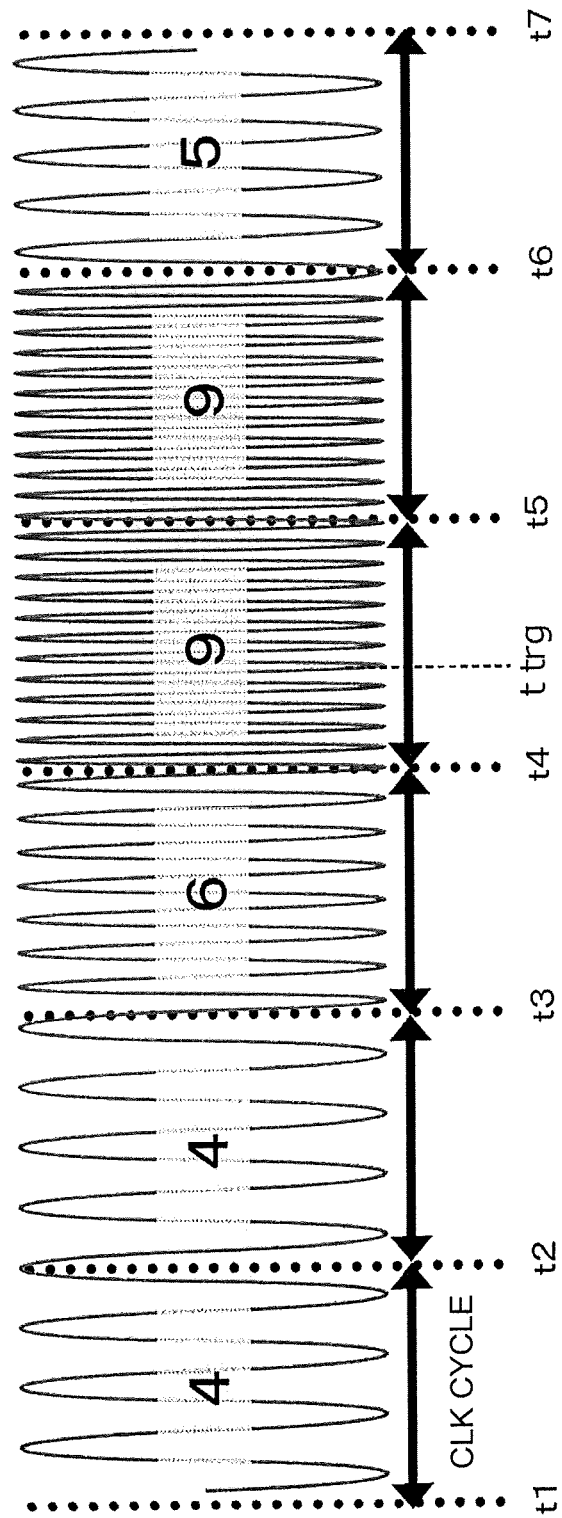
FIG. 2 is a waveform chart illustrating operation of the semiconductor circuitry of FIG. 1.

FIG. 2 is a waveform chart illustrating the operation of the semiconductor circuitry 1 of FIG. 1, which illustrates a waveform of the oscillation signal of the VCO 2. The oscillation frequency of the oscillation signal of the VCO 2 changes depending on the signal level of the first input signal. Each section divided by broken lines in FIG. 2 is each clock cycle of the clock signal CLK. Although FIG. 2 illustrates an exemplary case where the oscillation frequency of the oscillation signal of the VCO 2 changes every clock cycle for simplification, the oscillation frequency of the oscillation signal of the VCO 2 may change within one clock cycle in reality.

In the example of FIG. 2, the counter 3a counts count values 4, 4, 6, 9, 9, and 5 for clock cycles of time t1 to t2, t2 to t3, t3 to t4, t4 to t5, t5 to t6, and t6 to t7, respectively. Those respective count values are held in the FF 4a at the times t2, t3, t4, t5, t6, and t7. Therefore, the first digital signal changes in the order of 4, 4, 6, 9, 9, and 5 in each clock cycle.

Assuming that the second input signal transitions at time ttrg between the time t4 and t5, the FF 4a holds the count value of the counter 3a at the time ttrg. The count value in this case is 4, and thus the second digital signal is 4.

Figure 3:
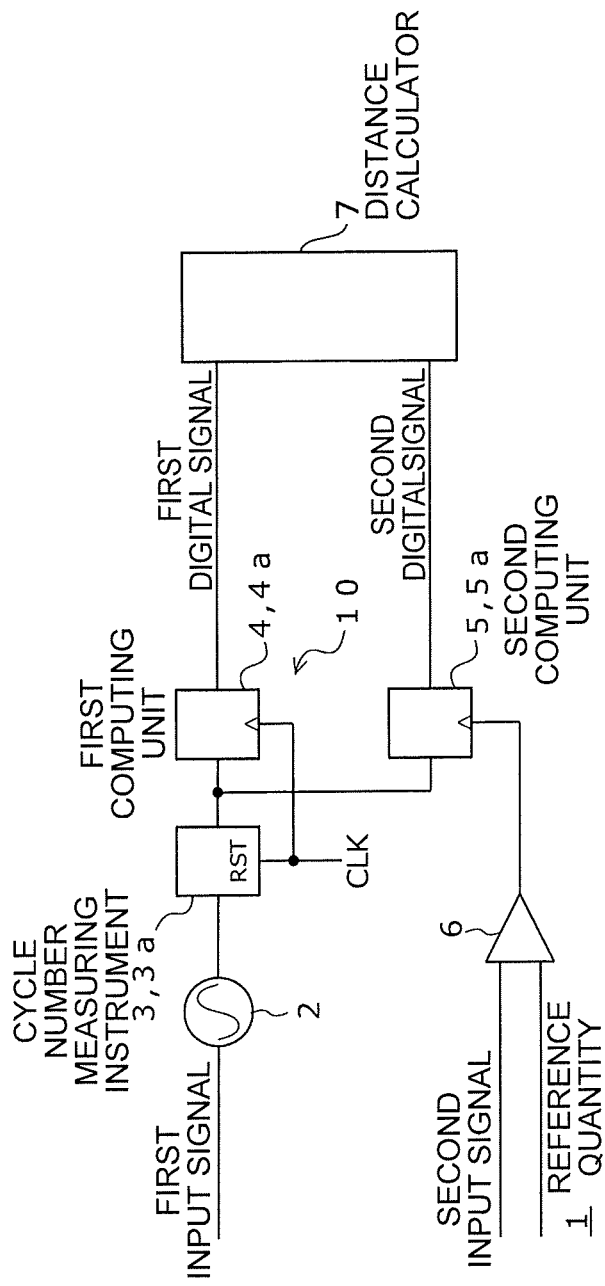
FIG. 3 is a block diagram illustrating a schematic configuration of the semiconductor circuitry in which a comparator and a calculator are provided in the semiconductor circuitry of FIG. 1.

FIG. 3 is a block diagram illustrating a schematic configuration of the semiconductor circuitry 1 in which a comparator 6 and a calculator 7 are provided in the semiconductor circuitry 1 of FIG. 1.

The comparator 6 generates a second input signal by comparing the physical value of the first input signal with a reference value. The physical value refers to the power, envelope, frequency, integral value, pulse width, or the like of the first input signal, and concrete content thereof is not limited as long as it is a physical value that can quantitatively evaluate the characteristics of the first input signal. The comparator 6 causes the second input signal to transition in the case where, for example, the physical value exceeds a reference quantity. In a case where the physical value is the signal level, the comparator 6 causes the second input signal to transition when the signal level of the first input signal exceeds a predetermined threshold value. Causing the second input signal to transition indicates, for example, causing the second input signal to change from low to high. In this manner, the second input signal functions as a trigger signal, and the comparator 6 functions as a trigger generation unit.

The calculator 7 measures, based on the first digital signal and the second digital signal, a time from when a light signal is emitted until when a reflected light signal obtained by the light signal reflected by an object is received, and calculates a distance to the object base on the measured time.

Figure 4:
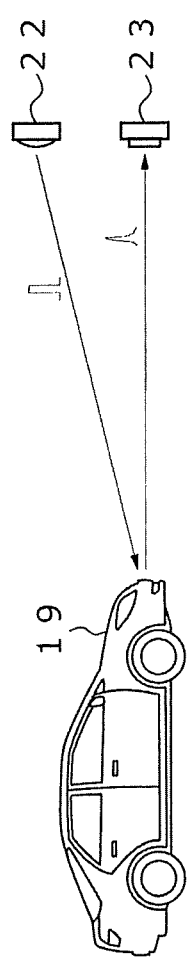
FIG. 4 is a diagram illustrating a relationship between a start signal and a first input signal.

FIG. 4 is a diagram illustrating a relationship between a start signal and the first input signal. A light signal, such as a laser beam, is emitted from a light source 22 according the timing of the start signal, and a reflected light signal reflected by an object, such as a vehicle is made incident on a light detector 23, such as a light receiving sensor, which is converted into a first input signal that is an electrical signal.

Figure 5:
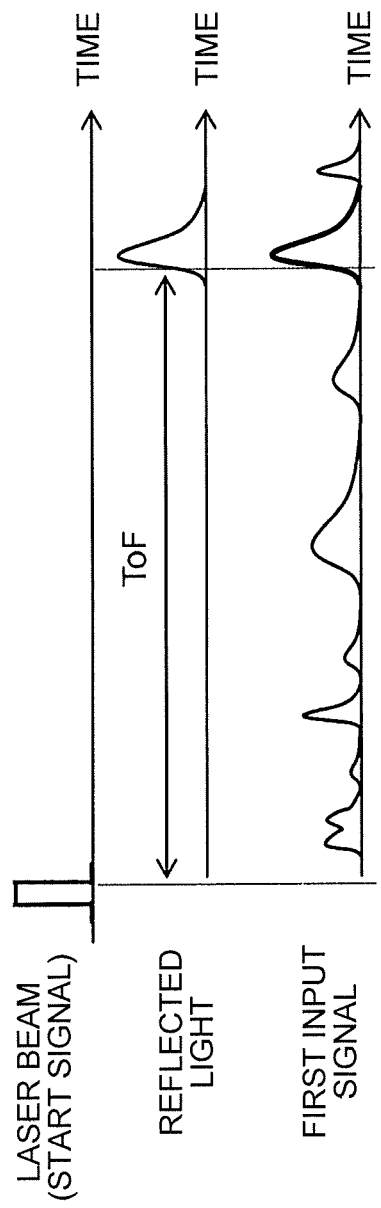
FIG. 5 is a waveform chart illustrating an exemplary light signal emitted from a light source and a reflected light signal.

FIG. 5 is a waveform chart illustrating an example of the light signal emitted from the light source 22 and the reflected light signal. The reflected light signal is received by the light detector 23 together with ambient light, such as sunlight. As the propagation distance of the reflected light signal is longer, the light intensity of the reflected light signal is weaker and is difficult to distinguish from ambient light. In FIG. 5, the reflected light signal is illustrated in bold.

The comparator 6 causes the second input signal to transition in the case where, for example, the signal level of the first input signal exceeds a predetermined threshold value. The calculator 7 measures a time from the timing of the start signal to the timing at which the reflected light signal is received, converted into the first input signal, and input to the oscillator 2, and converts it into a distance.

Figure 6:
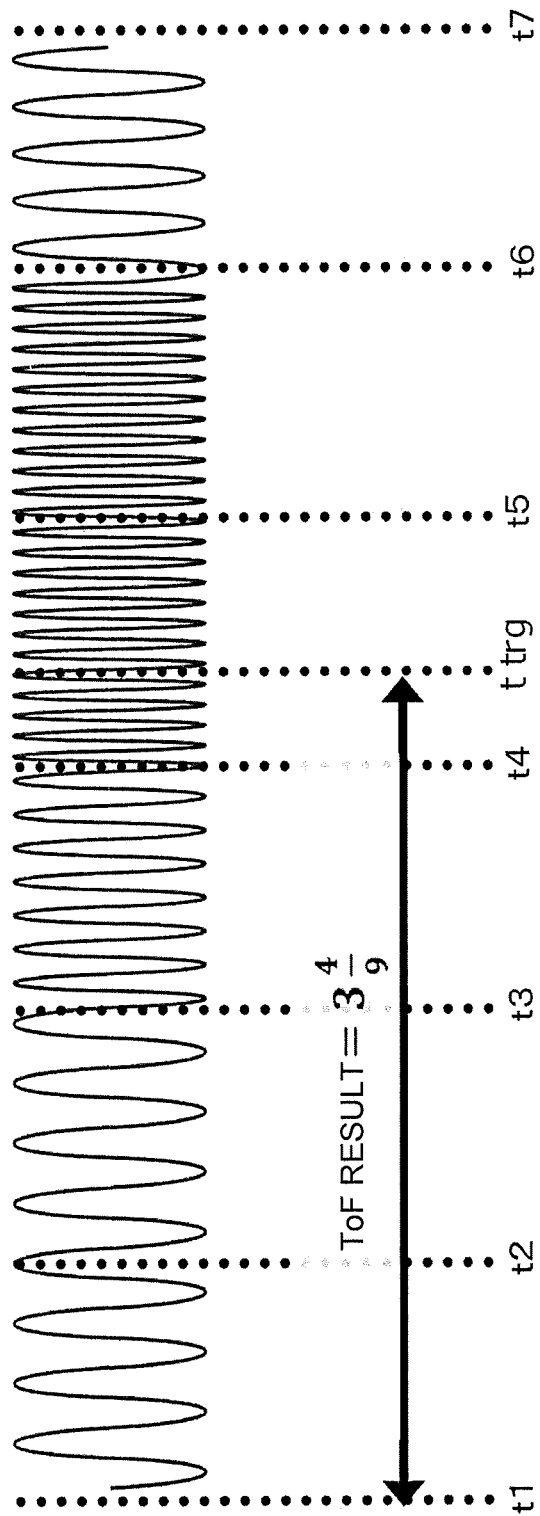
FIG. 6 is a diagram illustrating a method of measuring time corresponding to a distance in the case where a second input signal transitions at time ttrg in FIG. 2.

FIG. 6 is a diagram illustrating a method of measuring a time of flight (ToF) corresponding to a distance in the case where the second input signal transitions at the time ttrg in FIG. 2. The time t1 is the timing of the start signal. The first digital signal output from the first computing unit 4 during the clock cycle of the time t4 to t5 is 9, and the second digital signal output from the second computing unit 5 is 4. Further, since there are three clock cycles from the time t1 to t4, the calculator 7 measures the time ToF from the timing of the start signal to the transition timing of the second input signal as 3+(4/9), and calculates a distance using the speed of light from the time ToF.

As described above, in the first embodiment, the oscillator 2 and the counter 3a are shared by the first computing unit 4 that functions as an ADC and the second computing unit 5 that functions as a TDC so that the ADC and the TDC do not need to include a dedicated oscillator 2 and counter 3a, whereby a circuit size and power consumption can be reduced.

Second Embodiment

A second embodiment is a more specific version of the configuration of the semiconductor circuitry 1 according to the first embodiment.

Figure 7:
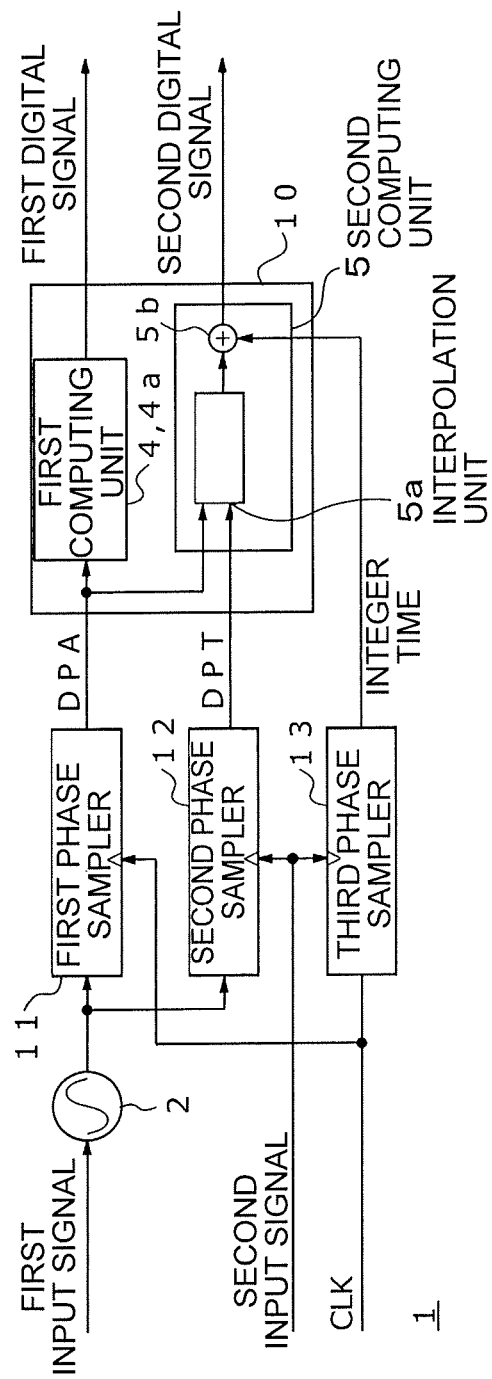
FIG. 7 is a block diagram illustrating a schematic configuration of a semiconductor circuitry according to a second embodiment.

FIG. 7 is a block diagram illustrating a schematic configuration of a semiconductor circuitry 1 according to the second embodiment. The semiconductor circuitry 1 of FIG. 7 includes an oscillator 2, a first phase sampler 11, a second phase sampler 12, a third phase sampler 13, a first computing unit 4, and a second computing unit 5. The first computing unit 4 and the second computing unit 5 are included in a computing unit 10.

Figure 8:
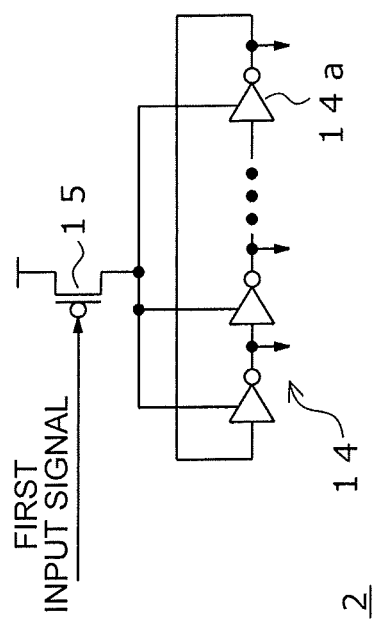
FIG. 8 is a circuit diagram illustrating an exemplary voltage controlled oscillator (VCO)

The oscillator 2 outputs an oscillation signal whose frequency is modulated according to a first input signal. The oscillator 2 is, for example, a VCO 2. FIG. 8 is a circuit diagram illustrating an example of the VCO 2. The VCO 2 of FIG. 8 includes a ring oscillator 14, and a P-channel metal oxide semiconductor (PMOS) transistor 15. The ring oscillator 14 is configured in such a manner that multiple variable delay inverters 14a capable of controlling a delay time are connected in a ring. The PMOS transistor 15 supplies power-supply voltage according to a signal level of the first input signal to the plurality of variable delay inverters 14a. Each variable delay inverter 14a switches a signal propagation delay time according to the power-supply voltage level. When the signal propagation delay time of each variable delay inverter 14a changes, an oscillation frequency of the ring oscillator 14 also changes. Accordingly, the VCO 2 of FIG. 8 modulates the oscillation frequency base on the signal level of the first input signal, that is, for example, the voltage or current level.

The first phase sampler 11 outputs a first phase digital signal DPA obtained by sampling the phase of the oscillation signal of the VCO 2 for each cycle of a clock signal CLK. The second phase sampler 12 outputs a second phase digital signal DPT obtained by sampling the phase of the oscillation signal of the VCO 2 at a timing when a second input signal transitions. That is, the second phase sampler 12 outputs the second phase digital signal based on sampling the phase of the oscillation signal at the input timing of the second input signal. The third phase sampler 13 outputs a third phase digital signal obtained by sampling the phase of the clock signal CLK at the timing when the second input signal transitions. That is, the third phase sampler 13 outputs the third phase digital signal based on sampling the phase of the clock signal at the input timing of the second input signal.

The first computing unit 4 outputs, for each clock cycle of the clock signal CLK, a first digital signal obtained by the first input signal digitally converted base on the first phase digital signal DPA. The first phase sampler 11 and the first computing unit 4 function as an ADC.

The second computing unit 5 outputs a second digital signal according to a period up to the timing at which the second input signal transitions. That is, the second computing unit 5 outputs the second digital signal according to the period up to the input timing of the second input signal. The first phase sampler 11, the second phase sampler 12, and the second computing unit 5 operate as a TDC.

Figure 9:
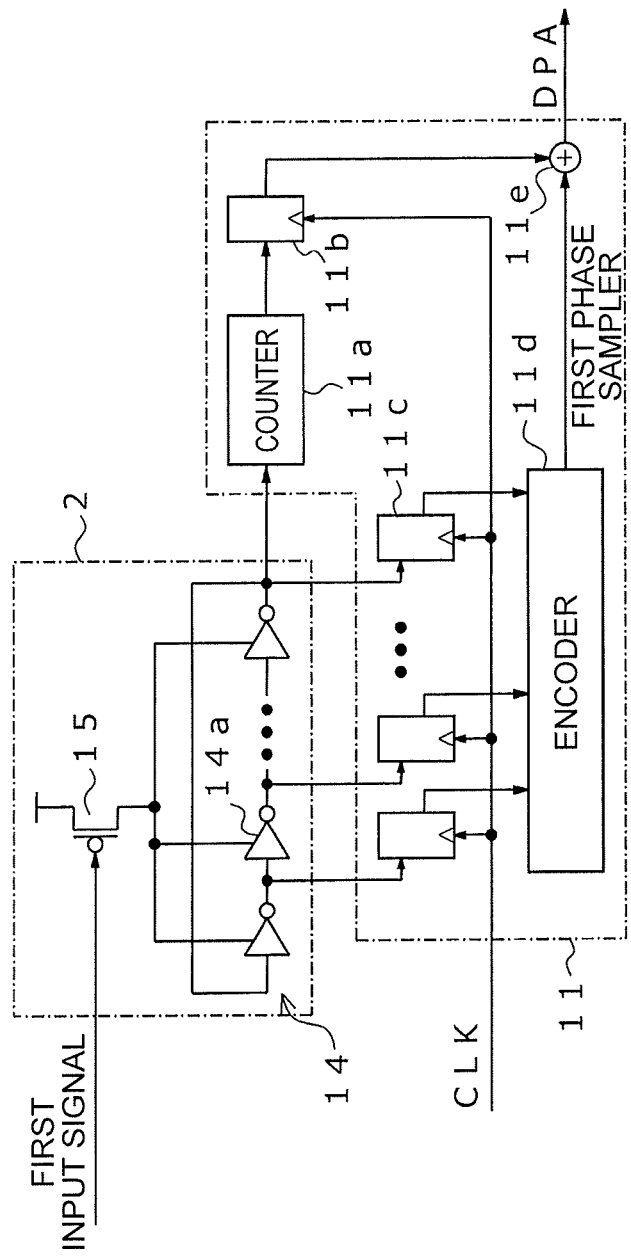
FIG. 9 is a block diagram illustrating an internal configuration of a first phase sampler.

FIG. 9 is a block diagram illustrating an internal configuration of the first phase sampler 11. As illustrated in FIG. 9, the first phase sampler 11 includes a counter 11a, an FF 11b, a plurality of FFs 11c, an encoder 11d, and an adder 11e.

The counter 11a is, for example, an up counter 11a counted up at the transition timing of the oscillation signal of the VCO 2. The transition timing of the oscillation signal of the VCO 2 is, for example, a timing at which the oscillation signal changes from low to high. The FF 11b holds a count value of the counter 11a for each clock cycle. The value held in the FF 11b corresponds to an integer phase digital signal of the oscillation signal of the VCO 2.

The plurality of FFs 11c hold output signals of the plurality of variable delay inverters 14a in the ring oscillator 14 in synchronization at the transition timing of the clock signal CLK. The encoder 11d encodes the signal held by each FF 11c into a decimal phase digital signal, and outputs it. With each output signal of each variable delay inverter 14a in the ring oscillator 14 held at the transition timing of the clock signal CLK, it becomes possible to obtain a phase digital signal with resolution higher than a value obtained by the oscillation signal of the VCO 2 measured by the counter 11a.

The adder 11e adds the integer phase digital signal held in the FF 11b and the decimal phase digital signal encoded by the encoder 11d to generate a first phase digital signal DPA. The second phase sampler 12 has, for example, a block configuration similar to that illustrated in FIG. 9. The second input signal is input instead of the clock signal CLK in FIG. 9. In this case, the encoder 11d outputs a decimal phase digital signal of the oscillation signal of the VCO 2 at the timing when the second input signal transitions.

Figure 10:
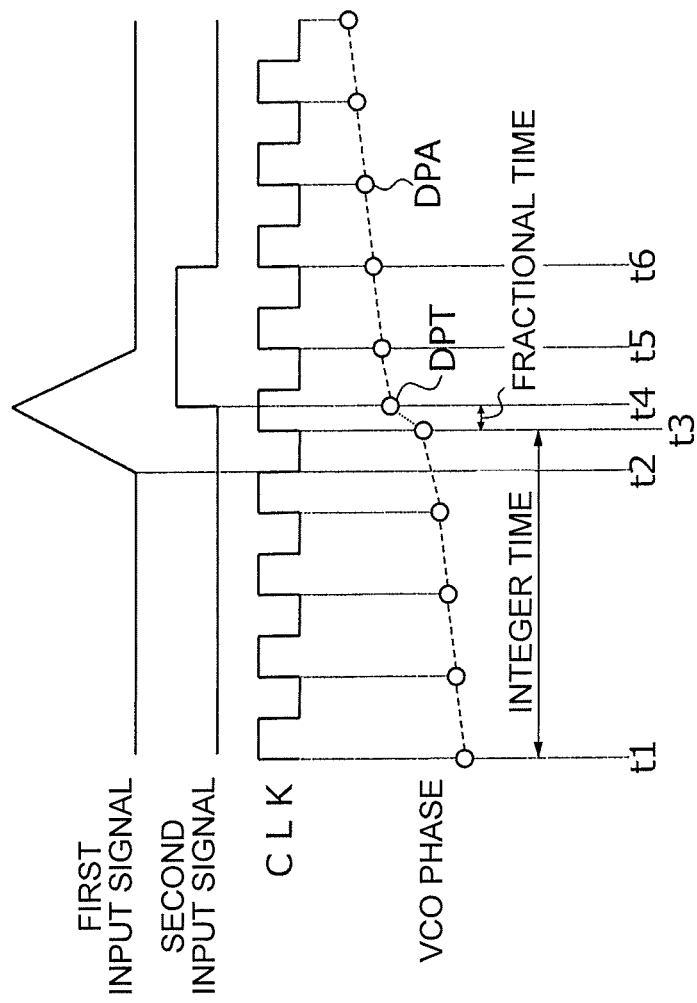
FIG. 10 is a signal waveform chart illustrating input/output timing of the semiconductor circuitry according to the second embodiment.

FIG. 10 is a signal waveform chart illustrating input/output timing of the semiconductor circuitry 1 according to the second embodiment. The time t1 is a timing of the start signal. During the period between the time t1 and the time t2, the signal level of the first input signal is a predetermined base level. Note that, in FIG. 10, it is assumed that the first input signal does not include noise signals, such as ambient light. When the signal level of the first input signal is at the base level, the VCO 2 oscillates at a fixed oscillation frequency corresponding to the base level. Therefore, the count value of the counter 3a linearly increases. The broken lines in FIG. 10 indicate the timings at which the clock signal CLK transitions, and each interval between the broken lines is a clock cycle.

The first phase sampler 11 outputs a first phase digital signal DPA obtained by digitizing the phase of the oscillation signal of the VCO 2 in synchronization at the timing when the clock signal CLK transitions.

In the case where the signal level of the first input signal changes from the time t2 to t5, the oscillation frequency of the oscillation signal of the VCO 2 changes according to the signal level. FIG. 10 illustrates an exemplary case where the second input signal transitions at the time t4. The second phase sampler 12 outputs a second phase digital signal DPT obtained by digitizing the phase of the oscillation signal of the VCO 2 in synchronization at the timing when the second input signal transitions. The third phase sampler 13 outputs a third phase digital signal obtained by digitizing the phase of the clock signal CLK in synchronization at the timing when the second input signal transitions. The third phase digital signal represents an integer time of the clock signal CLK.

The first computing unit 4 outputs a first digital signal obtained by the first phase digital signal DPA output from the first phase sampler 11 subject to time differentiation. The first digital signal is a signal obtained by the oscillation frequency of the oscillation signal of the VCO 2 digitized for each clock cycle. Since the oscillation frequency of the oscillation signal of the VCO 2 is dependent on the first input signal, the first digital signal is a signal dependent on the first input signal. For example, the first digital signal is a signal obtained by digitizing the signal level of the first input signal.

The second computing unit 5 generates a second digital signal base on processing of interpolating two or more first phase digital signals DPA close to the second phase digital signal DPT and the third phase digital signal. More specifically, the second computing unit 5 obtains a fractional time corresponding to the second phase digital signal DPT by polynomial interpolation of the two or more first phase digital signals DPA, and determines an integer time base on the third phase digital signal, thereby generating a second digital signal base on the fractional time and the integer time.

The second computing unit 5 includes, for example, an interpolation unit 5a, and an adder 5b. The interpolation unit 5a generates a fractional time signal base on the first phase digital signal DPA and the second phase digital signal DPT. The adder 5b adds the third phase digital signal that is an integer time signal generated by the third phase sampler 13 and the fractional time signal generated by the interpolation unit 5a to generate a second digital signal. The second digital signal is a time-digital signal from the timing of the start signal to the timing of the transition of the second input signal.

Figure 11:
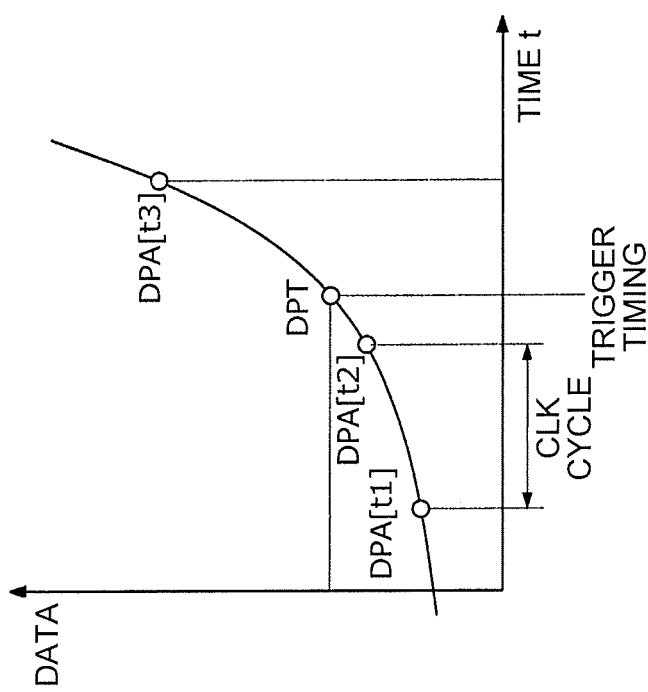
FIG. 11 is a graph illustrating operation of an interpolation unit.

FIG. 11 is a graph illustrating operation of the interpolation unit 5a. FIG. 11 is a graph in which the first phase digital signals DPA are plotted with a horizontal axis representing time and a vertical axis representing data values of the first phase digital signal DPA and the second phase digital signal DPT. Three first phase digital signals DPA [t1], DPA [t2], and DPA [t3] in the vicinity of the second phase digital signal DPT are plotted, and a quadratic interpolation curve passing through those three plots is generated. Then, the second phase digital signal DPT is placed on the quadratic interpolation curve to determine the time of the second phase digital signal DPT. The determined time is the timing at which the second input signal transitions, that is, the trigger timing.

The quadratic interpolation curve is expressed by, for example, the following formula (1).

$$f(t)=at^2+bt+c \quad (1)$$

The interpolation unit 5a inversely calculates the fractional time from the quadratic interpolation curve of the formula (1) base on the following formula (2).

$$\text{Fractional time}=f^{-1}(\text{DPT}) \quad (2)$$

Note that the interpolation unit 5a is capable of performing any interpolation, such as Lagrange interpolation and Newton's interpolation, in addition to the quadratic polynomial interpolation described above. The interpolation processing of the interpolation unit 5a can be performed even while the oscillation frequency of the VCO 2 is changing, and a fractional time with high accuracy can be measured.

As described above, the second computing unit 5 obtains the integer time by detecting the phase of the clock signal CLK with the transition time of the second input signal as a reference, and obtains the fractional time by detecting the phase of the oscillation signal of the VCO 2 with the transition time of the second input signal as a reference, whereby highly accurate time-to-digital conversion can be performed.

In this manner, in the semiconductor circuitry 1 according to the second embodiment, the VCO 2 and the first phase sampler 11 are shared by the first computing unit 4 that functions as an ADC and the second computing unit 5 that functions as a TDC, whereby a circuit size and power consumption can be reduced.

Third Embodiment

Figure 12:
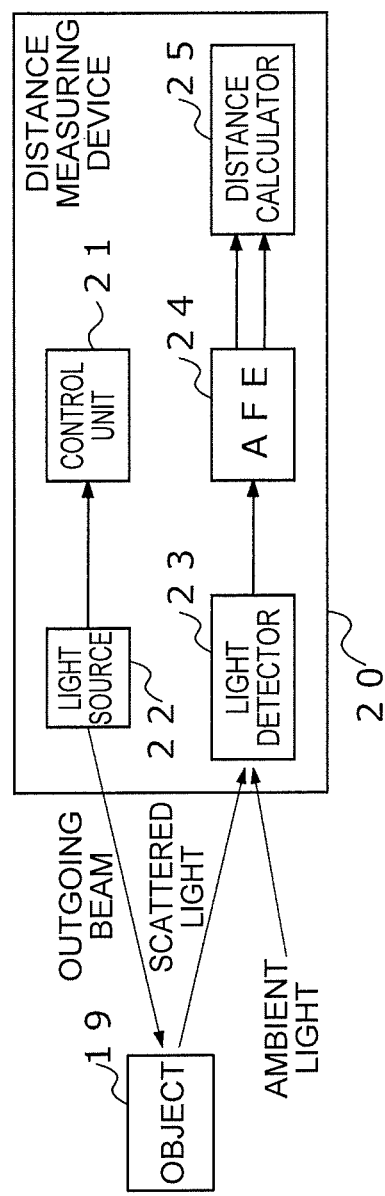
FIG. 12 is a block diagram illustrating a schematic configuration of a distance measuring device 20 incorporating a semiconductor circuitry according to a third embodiment.

FIG. 12 is a block diagram illustrating a schematic configuration of a distance measuring device 20 incorporating a semiconductor circuitry 1 according to a third embodiment. The distance measuring device 20 of FIG. 12 includes a control unit 21, a light source 22, a light detector 23, an analog front end (hereinafter referred to as AFE) unit 24, and a calculator 25.

The control unit 21 controls an emission timing of the light source 22. When the control unit 21 transmits a start signal to the light source 22, the light source 22 emits a light signal. The light source 22 is a laser diode or a light emitting device (LED). The light signal (hereinafter referred to as a first light signal) emitted from the light source 22 is scattered by an object 19 in a monitoring area, and the scattered light is made incident on the distance measuring device 20. Ambient light other than the light source 22, such as sunlight, is also made incident on the distance measuring device 20 as direct light or reflected light from the object 19.

The light having been made incident on the distance measuring device 20 is converted into an electrical signal by the light detector 23. The light detector 23 can include, for example, a photodiode, an avalanche photodiode, a single photon avalanche photodiode, or the like. The light detector 23 receives a second light signal including a reflected light signal obtained by the first light signal emitted from the light source 22 reflected by the object 19, and converts it into a first input signal that is an electrical signal.

The first input signal, which is an electrical signal converted by the light detector 23, is input to the AFE unit 24, and amplitude information and time information of the electrical signal are converted into digital values. Here, the time information is a timing at which the amplitude of the electrical signal exceeds a certain threshold value, which represents a time ToF from the timing at which the outgoing beam is emitted until the time at which the AFE unit 24 detects the scattered light via the light detector 23. The AFE unit 24 can be configured by, for example, the semiconductor circuitry 1 according to the second embodiment. The AFE unit 24 outputs a first digital signal and a second digital signal representing a light receiving timing of the reflected light signal base on the first input signal.

The calculator 25 measures a distance to the object 19 by which the first light signal is reflected. More specifically, the calculator 25 measures a time from the timing of the start signal to the transition of a second input signal, and measures a distance to the object 19 base on this time.

Each unit of the distance measuring device 20 of FIG. 12 can be mounted on one semiconductor substrate, and can be made into one chip. Alternatively, only the light source 22 may be a separate chip, or the light source 22 and the light detector 23 may be separate chips.

In this manner, in the third embodiment, the distance measuring device 20 can be configured using the semiconductor circuitry 1 according to the second embodiment.

Fourth Embodiment

Figure 13:
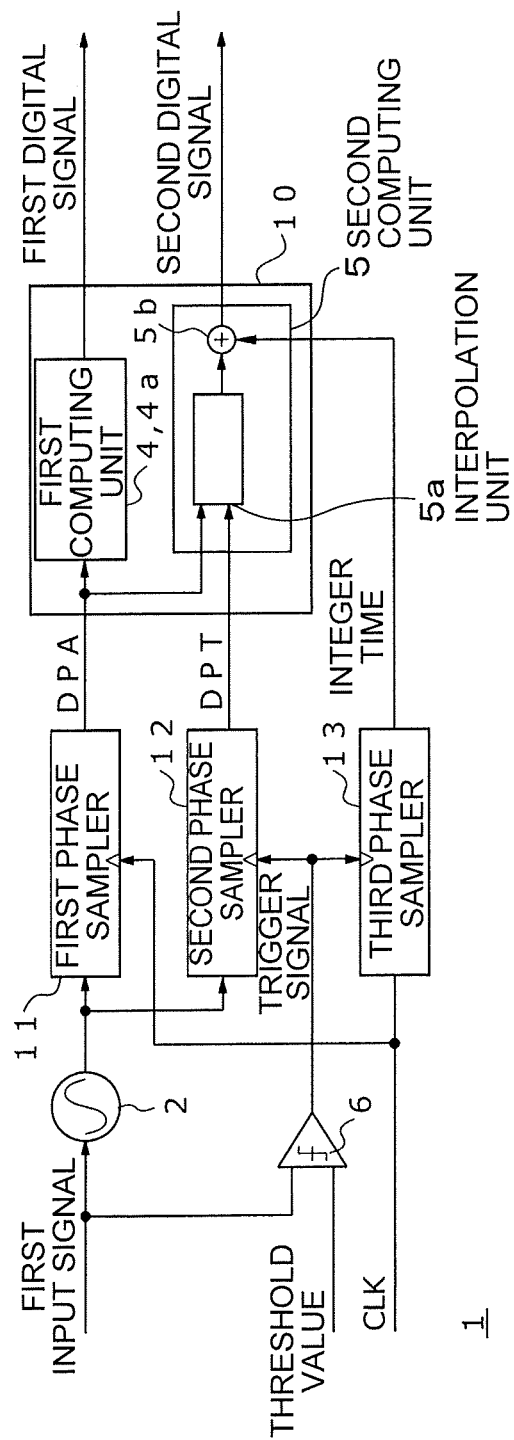
FIG. 13 is a block diagram illustrating a schematic configuration of a semiconductor circuitry according to a fourth embodiment.

FIG. 13 is a block diagram illustrating a schematic configuration of a semiconductor circuitry 1 according to a fourth embodiment. The semiconductor circuitry 1 of FIG. 13 includes a comparator 6 in addition to the configuration of the semiconductor circuitry 1 of FIG. 7. The comparator 6 generates a second input signal base on a first input signal. More specifically, the comparator 6 generates a second input signal by comparing the physical value of the first input signal with a predetermined reference quantity. In a case where the physical value is the signal level, the comparator 6 may cause the second input signal to transition when the signal level of the first input signal exceeds a predetermined reference level. In this manner, the comparator 6 functions as a trigger generation unit that generates a second input signal that is a trigger signal.

In order to appropriately extract reflected light buried in ambient light, the comparator 6 sets a reference quantity and a reference level to detect a reflected light component included in the first input signal. When the reflected light component is detected, the second input signal is caused to transition.

The semiconductor circuitry 1 of FIG. 13 can be used for the AFE unit 24 in the distance measuring device 20 of FIG. 12.

In this manner, in the fourth embodiment, the comparator 6 is provided and the second input signal is generated from the first input signal, whereby the reflected light of the object 19 can be appropriately extracted from the light made incident on the distance measuring device 20 to generate the second input signal.

Fifth Embodiment

Figure 14:
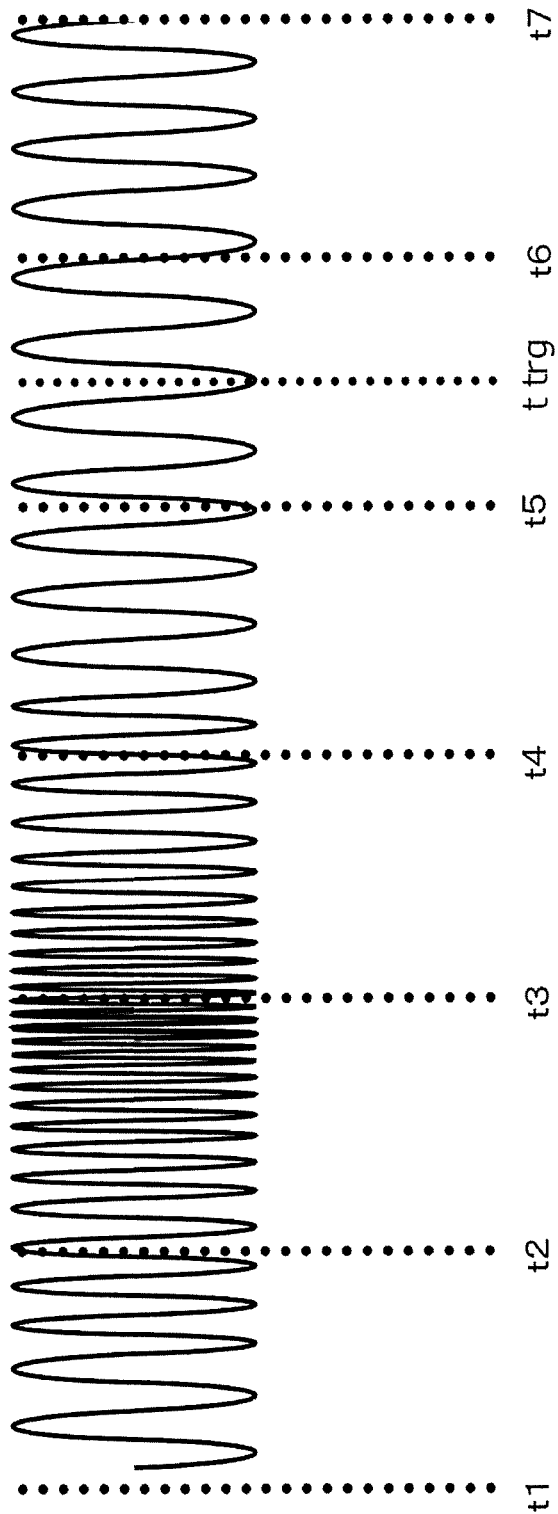
FIG. 14 is a waveform chart illustrating an example in which an oscillation frequency changes within a clock cycle.

An oscillation signal of a VCO 2 is subject to frequency modulation according to a first input signal. Accordingly, as illustrated in FIG. 14, an oscillation frequency of the oscillation signal may largely change even within one clock cycle. In particular, in a signal area corresponding to a reflected light component included in the first input signal, signal amplitude may rapidly increase in a short time width. In such a case, the oscillation frequency of the oscillation signal of the VCO 2 rapidly increases, and immediately thereafter, the oscillation frequency rapidly decreases, whereby the oscillation frequency becomes unstable.

In the semiconductor circuitry 1 according to the first to third embodiments described above, when an unstable oscillation signal is input, accuracy of a complement process may be degraded. In view of the above, a semiconductor circuitry 1 according to a fifth embodiment is to take measures against an unstable oscillation signal.

Figure 15:
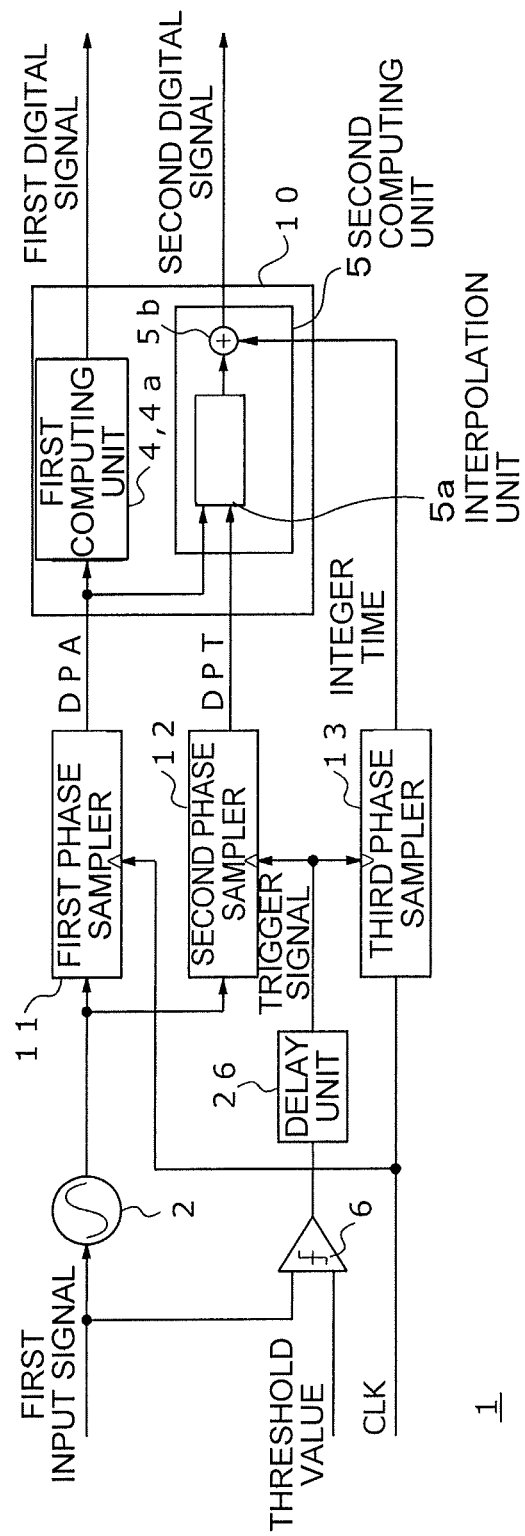
FIG. 15 is a block diagram illustrating a schematic configuration of a semiconductor circuitry according to a fifth embodiment.
Figure 16:
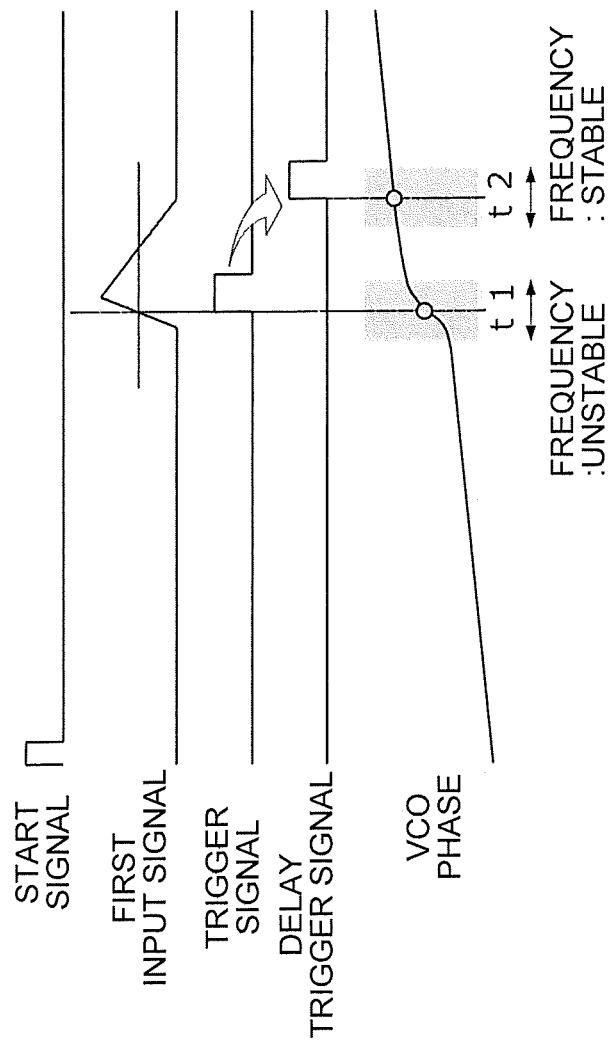
FIG. 16 is a signal waveform chart illustrating input/output timing of the semiconductor circuitry according to the fifth embodiment.

FIG. 15 is a block diagram illustrating a schematic configuration of the semiconductor circuitry 1 according to the fifth embodiment, and FIG. 16 is a signal waveform chart illustrating input/output timing of the semiconductor circuitry 1 according to the fifth embodiment. The semiconductor circuitry 1 of FIG. 15 includes a delay unit 26 in addition to the configuration of the semiconductor circuitry 1 of FIG. 13. The delay unit 26 delays a second input signal output from a comparator 6 for a predetermined time. The predetermined time needs to be a time until the end of the signal area corresponding to the reflected light component included in the first input signal. More specifically, the predetermined time is preferably a time until when the oscillation frequency of the oscillation signal of the VCO 2 is stabilized after the end of the signal area including the reflected light component.

With the second input signal delayed by the delay unit 26 for a predetermined time, the second signal transitions (a trigger signal is output) at time t2 delayed for a predetermined time from time t1 while originally the second signal transitions (a trigger signal is output) at the time t1 of FIG. 16. In the case where the oscillation signal at the time t2 is stable without changing a frequency so much within the clock cycle, a first phase sampler 11 and a second phase sampler 12 can generate a first phase digital signal DPA and a second phase digital signal DPT with high accuracy.

Figure 17:
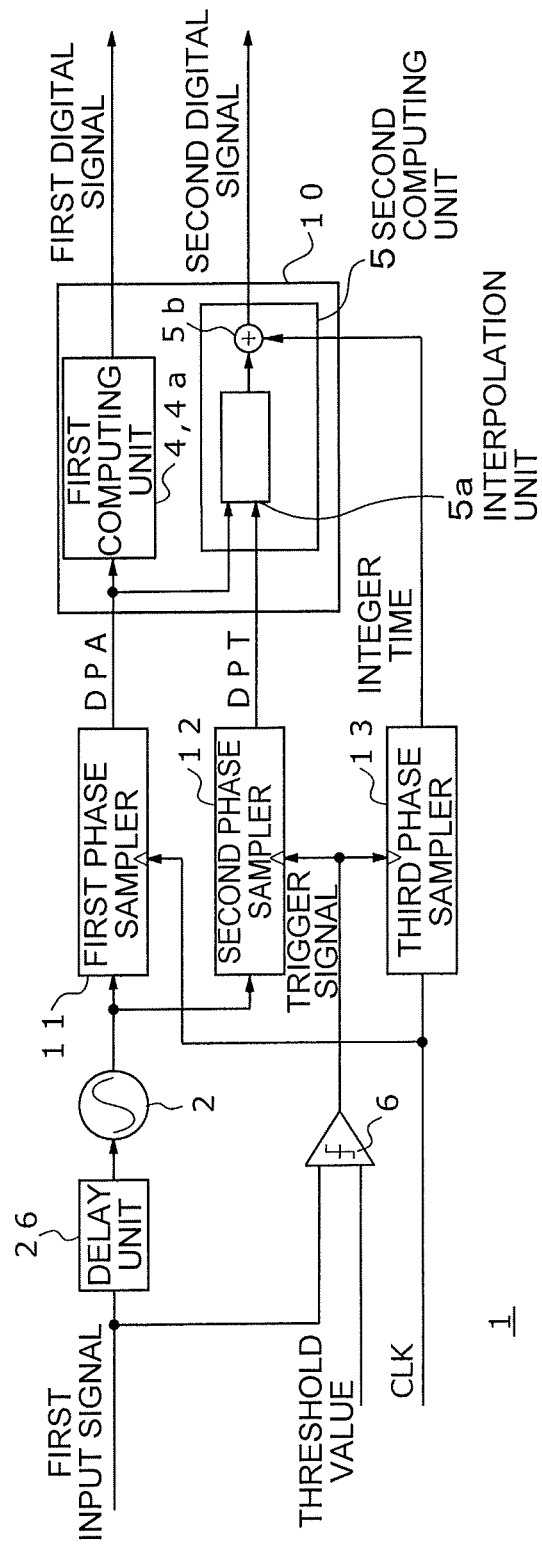
FIG. 17 is a block diagram illustrating a schematic configuration of a semiconductor circuitry according to a variation of FIG. 15.

FIG. 17 is a block diagram illustrating a schematic configuration of a semiconductor circuitry 1 according to a variation of FIG. 15. The semiconductor circuitry 1 of FIG. 17 includes the delay unit 26 added to the front stage of the VCO 2 in addition to the semiconductor circuitry 1 of FIG. 13. The delay unit 26 delays the first input signal for a predetermined time and then inputs it to the VCO 2. The VCO 2 outputs an oscillation signal subject to frequency modulation based on the delayed input signal obtained by the first input signal delayed for the predetermined time.

The comparator 6 generates a second input signal base on the original first input signal that is not delayed. The first phase sampler 11 and the second phase sampler 12 output the first phase digital signal DPA and the second phase digital signal DPT base on the oscillation signal subject to the frequency modulation based on the delayed input signal. The first phase digital signal DPA and the second phase digital signal DPT are delayed for a predetermined time from the transition timing of the second input signal. Therefore, since the first phase digital signal DPA and the second phase digital signal DPT are generated base on the stabilized oscillation signal, in a similar manner to FIG. 15, the first phase digital signal DPA and the second phase digital signal DPT can be generated after the oscillation signal is stabilized.

In this manner, in the fifth embodiment, the delay unit 26 is provided to delay the second input signal generated by the comparator 6 for a predetermined time, or to delay the first input signal input to the VCO 2 for a predetermined time, the first phase digital signal DPA and the second phase digital signal DPT can be generated by the first phase sampler 11 and the second phase sampler 12 after the oscillation frequency of the oscillation signal of the VCO 2 is stabilized.

Sixth Embodiment

Figure 18:
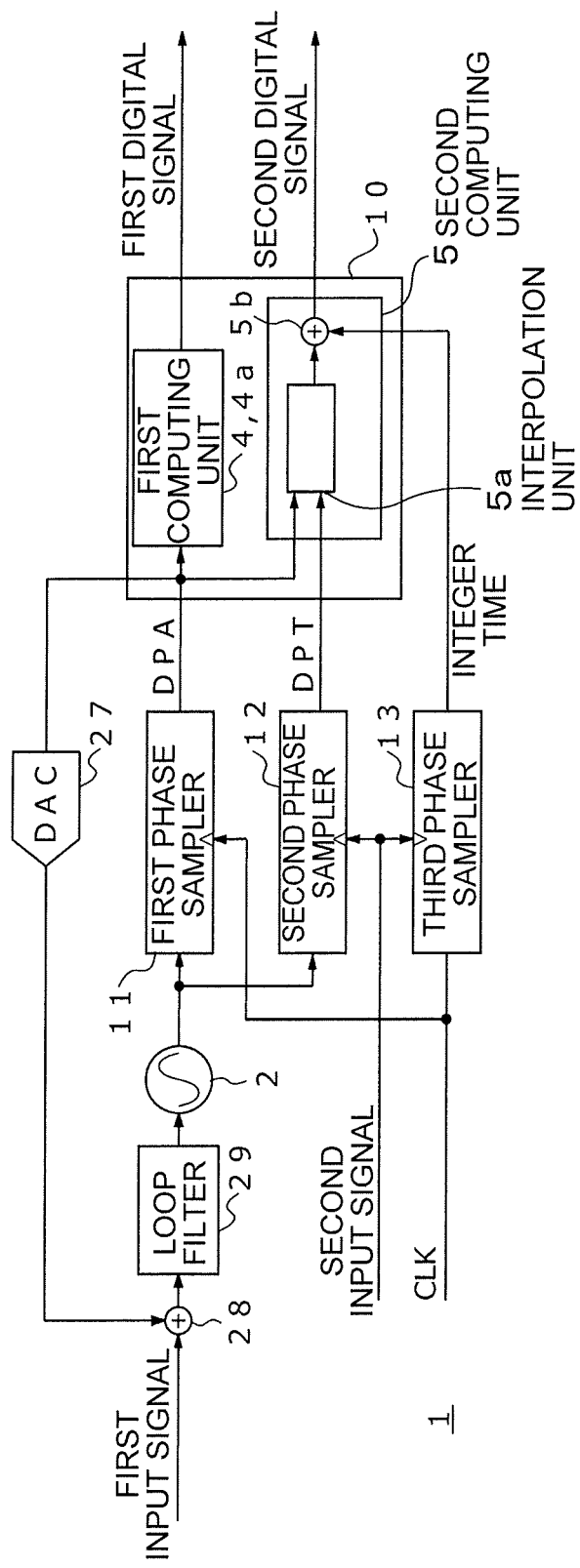
FIG. 18 is a block diagram illustrating a schematic configuration of a semiconductor circuitry according to a sixth embodiment.

FIG. 18 is a block diagram illustrating a schematic configuration of a semiconductor circuitry 1 according to a sixth embodiment. The semiconductor circuitry 1 of FIG. 18 includes a digital/analog (DA) converter (DAC) 27, a differentiator 28, and a loop filter 29 in addition to the configuration of the semiconductor circuitry 1 of FIG. 7. The DAC 27 converts a first phase digital signal DPA output from a first phase sampler 11 into a phase analog signal. The differentiator 28 outputs a first input signal and a difference signal between an output signal of the DAC 27 and the first input signal. The loop filter 29 inputs a signal obtained by the difference signal integrated to a VCO 2 instead of the first input signal. The loop filter 29 functions as an integrator.

In the semiconductor circuitry 1 of FIG. 18, the VCO 2 and the first phase sampler 11 are included in a delta-sigma AD converter. The first phase digital signal DPA is fed back to the input side of the VCO 2 by the DAC 27 and the loop filter 29, whereby quantization noise at the time of AD conversion can be further reduced.

Note that the DAC 27 and the differentiator 28 of FIG. 18 may be added to the semiconductor circuitry 1 of FIG. 15 or 17.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor circuitry comprising:
an oscillator configured to output an oscillation signal whose frequency depends on a signal level of a first input signal;
a counter configured to count a number of cycles of the oscillation signal;
first circuitry configured to output a first digital signal based on a first number of cycles counted by the counter within one of a clock cycle of a clock signal, wherein the first input signal is digitally converted into the first digital signal;
a second circuitry configured to output a second digital signal based on a second number of cycles counted by the counter in a period from a reference timing of the clock signal to an input timing of a second input signal within the one of the clock cycle of the clock signal, wherein the period is digitally converted into the second digital signal; and
a calculator configured to measure, based on the first digital signal, the second digital signal and a number of the clock cycle of the clock signal in a period from an input start timing of the first input signal to the input timing of the second input signal, a time from when a light signal is emitted until when a reflected light signal obtained by the light signal reflected by an object is received, and calculates a distance to the object based on the time,
wherein the calculator is further configured to calculate the distance based on a value obtained by adding the number of the clock cycle of the clock signal in the period from the input start timing of the first input signal to the input timing of the second input signal and a value obtained by dividing the second digital signal by the first digital signal.

2. The semiconductor circuitry according to claim 1, further comprising:
a comparator configured to generate the second input signal by comparing a value of the first input signal with a reference value.

3. A distance measuring device comprising:
a light source configured to emit a first light signal in accordance with a timing of a start signal;
a light detector configured to receive a second light signal including a reflected light signal of the first light signal reflected by an object and to convert the second light signal into the first input signal, the first input signal being an electrical signal;
a front end unit configured to include the semiconductor circuitry according to claim 1 and to output, based on the first input signal, the first digital signal and the second digital signal representing a reception timing of the reflected light signal; and
a distance computing unit configured to measure, based on the first digital signal and the second digital signal, a time from the timing of the start signal to when the second input signal is input, and measures a distance to the object based on the measured time,
wherein the distance computing unit is further configured to calculate the distance based on a value obtained by adding the number of the clock cycle of the clock signal in the period from the input start timing of the first input signal to the input timing of the second input signal and a value obtained by dividing the second digital signal by the first digital signal.

4. The distance measuring device according to claim 3, further comprising:
a comparator configured to generate the second input signal by comparing a physical value of the first input signal with a reference value.

5. A semiconductor circuitry comprising:
an oscillator configured to output an oscillation signal whose frequency depends on a signal level of a first input signal;
a first phase sampler configured to output a first phase digital signal based on sampling a phase of the oscillation signal in a clock cycle of a clock signal;
a second phase sampler configured to output a second phase digital signal based on sampling the phase of the oscillation signal at an input timing of a second input signal;
a third phase sampler configured to output a third phase digital signal based on sampling a phase of the clock signal at the input timing of the second input signal,
first circuitry configured to output a first output digital signal based on the first phase digital signal, wherein the first input signal is digitally converted into the first output digital signal;
second circuitry configured to generate a second digital signal according to a period up to the input timing of the second input signal based on the first phase digital signal, the second phase digital signal, and the third phase digital signal, wherein the period is digitally converted into the second digital signal; and
a calculator configured to measure, based on the first digital signal and, the second digital signal and a number of the clock cycle of the clock signal in a period from an input start timing of the first input signal to the input timing of the second input signal, a time from when a light signal is emitted until when a reflected light signal obtained by the light signal reflected by an object is received, and calculates a distance to the object based on the time, wherein the calculator is further configured to calculate the distance based on a value obtained by adding the number of the clock cycle of the clock signal in the period from the input start timing of the first input signal to the input timing of the second input signal and a value obtained by dividing the second digital signal by the first digital signal.

6. The semiconductor circuitry according to claim 5, wherein the first circuitry generates the first digital signal by performing time differentiation on the first phase digital signal, and the second circuitry generates the second digital signal based on processing of interpolating two or more of the first phase digital signals close to the second phase digital signal and the third phase digital signal.

7. The semiconductor circuitry according to claim 6, wherein the second circuitry obtains a fractional time corresponding to the second phase digital signal by polynomial interpolation of the two or more of the first phase digital signal, obtains an integer time based on the third phase digital signal, and generates the second digital signal based on the fractional time and the integer time.

8. The semiconductor circuitry according to claim 4, further comprising:

a delay unit configured to delay the second input signal, wherein the second phase sampler outputs the second phase digital signal at a timing when the second input signal delayed by the delay unit transitions, and the third phase sampler outputs the third phase digital signal at the timing when the delayed second input signal transitions.

9. The semiconductor circuitry according to claim 5, further comprising:

a delay unit configured to delay the first input signal, wherein the oscillator outputs the oscillation signal whose frequency is modulated according to a signal level of the first input signal delayed by the delay unit.

10. The semiconductor circuitry according to claim 5, further comprising:

a comparator configured to generate the second input signal by comparing a physical value of the first input signal with a reference value.

11. The semiconductor circuitry according to claim 10, wherein the physical value is power, an envelope shape, a frequency, an integral value, or a pulse width of the first input signal.

12. The semiconductor circuitry according to claim 5, further comprising:

a digital/analog (DA) converter configured to convert the first phase digital signal into a phase analog signal; and a loop filter configured to input, to the oscillator, a signal integrated based on a difference signal between the first input signal and the phase analog signal instead of the first input signal.

13. A distance measuring device comprising:

a light source configured to emit a first light signal in accordance with a timing of a start signal;

a light detector configured to receive a second light signal including a reflected light signal of the first light signal reflected by an object and converts the second light signal into the first input signal, the first input signal being an electrical signal;

a front end unit that comprises the semiconductor circuitry according to claim 4 and outputs, based on the first input signal, the first digital signal and the second digital signal representing a reception timing of the reflected light signal; and a distance computing unit configured to measure, based on the first digital signal and the second digital signal, a time from the timing of the start signal to when the second input signal is input, and to measure a distance to the object based on the measured time, wherein the distance computing unit is further configured to calculate the distance based on a value obtained by adding the number of the clock cycle of the clock signal in the period from the input start timing of the first input signal to the input timing of the second input signal and a value obtained by dividing the second digital signal by the first digital signal.

14. The distance measuring device according to claim 13, wherein the first circuitry generates the first digital signal by performing time differentiation on the first phase digital signal, and the second circuitry generates the second digital signal based on processing of interpolating two or more of the first phase digital signals close to the second phase digital signal and the third phase digital signal.

15. The distance measuring device according to claim 14, wherein the second circuitry obtains a fractional time corresponding to the second phase digital signal by polynomial interpolation of the two or more of the first phase digital signal, obtains an integer time based on the third phase digital signal, and generates the second digital signal based on the fractional time and the integer time.

16. The distance measuring device according to claim 13, further comprising:

a delay unit configured to delay the second input signal, wherein the second phase sampler outputs the second phase digital signal at the input timing of the second input signal, and the third phase sampler outputs the third phase digital signal at the input timing of the delayed second input signal transitions.

17. The distance measuring device according to claim 13, further comprising:

a delay unit configured to delay the first input signal, wherein the oscillator outputs the oscillation signal whose frequency is modulated according to a signal level of the first input signal delayed by the delay unit.

18. The distance measuring device according to claim 13, further comprising:

a comparator configured to generate the second input signal by comparing a physical value of the first input signal with a reference value.

19. The distance measuring device according to claim 18, wherein the physical value is power, an envelope shape, a frequency, an integral value, or a pulse width of the first input signal.

* * * * *